United States Patent [19]

Valdettaro

[11] Patent Number: 4,597,106
[45] Date of Patent: Jun. 24, 1986

[54] AFT DEFEAT ARRANGEMENT

[75] Inventor: Alarico A. Valdettaro, Bloomington, Ind.

[73] Assignee: Sarkes Tarzian Licensing Laboratory, Bloomington, Ind.

[21] Appl. No.: 723,078

[22] Filed: Apr. 15, 1985

[51] Int. Cl.[4] ............................................. H04B 1/16
[52] U.S. Cl. .................... 455/173; 455/170; 334/48; 74/10.41
[58] Field of Search ............... 358/191.1; 455/173, 455/170; 334/26, 48; 74/10.33, 10.41, 10.54

[56] References Cited

U.S. PATENT DOCUMENTS

| | | | |
|---|---|---|---|
| 3,489,029 | 1/1970 | Cappelle et al. | 74/10.41 X |
| 3,757,227 | 9/1973 | Weigel | 455/173 |
| 3,798,579 | 3/1974 | Tap | 74/10.33 X |
| 3,842,683 | 10/1974 | Valdettaro | 74/10.41 |
| 3,906,805 | 9/1975 | Badger et al. | 74/10.54 |
| 3,924,209 | 12/1975 | Valdettaro | 334/39 |

Primary Examiner—James J. Groody
Assistant Examiner—E. Anne Toth
Attorney, Agent, or Firm—Mason, Kolehmainen, Rathburn & Wyss

[57] ABSTRACT

A pair of stator contacts, which are positioned inside the tuner housing and are internally connected to the AFT circuit within the tuner housing, are positioned so that unused tuning coils carried by the station selector shaft of the tuner are momentarily connected to this pair of stator contacts as the station selector shaft is moved from one detented channel position to the next. Each time a tuning coil is connected to the AFT circuit it defeats the AFT operation thereof and prevents the AFT circuit from controlling the local oscillator until the next detented channel position is reached. When the station selector shaft reaches a detented channel position at least one of the pair of stator contacts is not connected to any of the tuning coils of the tuner so that the AFT circuit is free to control the local oscillator in a conventional manner.

6 Claims, 2 Drawing Figures

AFT DEFEAT ARRANGEMENT

The present invention is directed to an arrangement for inhibiting or defeating the automatic fine tuning (AFT) action in a television tuner during changes from one channel to another.

BACKGROUND OF THE INVENTION

Most television tuners have means to interrupt the automatic fine tuning (AFT) circuit of a television tuner during periods when the selector shaft of the tuner is moved from one channel to another. This is necessary because transient frequency excursions during commutation, and residual AFT energy from the channel being abandoned, can cause undesirable interactions between the AFT circuit and the local oscillator which sometimes results in a so-called AFT lock out condition wherein the operation of the automatic fine tuning circuit captures the local oscillator and maintains that a stable frequency which is, however, not the correct one for the channel selected. Also, for filtering and circuit stability reasons, the AFT voltage source is normally heavily by passed with a large capacitor so that the AFT control voltage remains at the level required for the channel being abandoned upon reaching an adjacent channel which has been selected. Unless discharged before reaching the adjacent channel, the AFT charge potential may cause momentary detuning of the oscillator at this new channel shifting it to regions resulting in the reception of undesired signals on which the AFT circuit may become locked.

To prevent the aforementioned malfunctioning during changing of channels, it is common practice to provide automatic means to momentarily suppress the AFT action while channels are being changed. This is generally accomplished by a switch, sometimes called an AFT defeat switch, which is mechanically actuated between channel positions and is effective in placing the AFT circuit in its quiescent state and in preventing it from controlling the local oscillator until the desired channel commutation has been completed. This AFT defeat switch is generally actuated by cams or linkages that sense the position of mechanical elements in the tuner, such as the channel detent means, to cause AFT disabling action between channel positions. Electrically, the AFT suppression is accomplished by momentarily connecting the AFT control line to a reference source of voltage by means of the AFT defeat switch. When the desired channel has been selected and the detent means is seated, the AFT switch disabling function ceases and the AFT circuit is enabled to perform the function of keeping the local oscillator on the correct frequency, as long as the selected channel is not changed.

The AFT defeat switches heretofore used have been external to the tuner housing and have been controlled by followers, actuators and the like which sense the position of the mechanical elements involved in channel changing, such as the channel detent means, these followers or actuators functioning to cause the switch to close or to open at the appropriate time. Since these switches are external to the tuner shaft they require wiring interconnection with the internal circuits of the tuner associated with the AFT function. These mechanical elements which control the disabling and re-enabling of the AFT circuit must be accurately synchronized with the channel changing operation so that automatic frequency control of the oscillator is reestablished only when the frequency of the oscillator has stabilized upon reaching the detent seated position. The normal dimensional variations in mass produced mechanical elements, such actuating cams, levers or followers, makes the inclusion of adjusting means on the switch actuating train mandatory, thereby adding to the complexity and cost of the system as well as requiring skilled personnel for the adjustments required to provide adequate synchronization. Additionally, the wiring interconnection between the internal local oscillator circuit and the external switch can cause leakage of high frequency energy from the oscillator which produces undesirable interference with receivers in the vicinity of the local oscillator.

Examples of such prior art AFT defeat mechanisms are shown in Chipman U.S. Pat. No. 3,328,700, Milnes U.S. Pat. No. 3,466,549, Tap U.S. Pat. No. 3,798,579, Susuki U.S. Pat. No. 3,870,961, Valdettaro U.S. Pat. No. 3,842,683, Badger U.S. Pat. No. 3,906,805, and Valdettaro U.S. Pat. No. 3,924,209.

BRIEF SUMMARY OF THE INVENTION

In the AFT defeat arrangement of the present invention a pair of stator contacts which are positioned inside the tuner housing and are internally connected to the AFT circuit within the tuner housing, are positioned so that unused tuning coils, carried by the station selector shaft of the tuner, are momentarily connected between this pair of stator contacts as the station selector shaft is moved from one detented channel position to the next. The impedance of the unused tuning coil which is connected across this pair of stator contacts is sufficiently low to defeat the operation of the AFT circuit while the coil is connected to said pair of stator contacts. Also, the tuning coil impedance is sufficiently low to discharge the large bypass capacitor which is conventionally connected across the AFT control terminals so that this capacitor does not influence the tuning of the next selected channel. However, the pair of stator contacts are positioned so that they do not engage any of the unused tuning coils when the station selector shaft is positioned in a detented channel selecting position so that the AFT circuit is permitted to function in a normal manner to receive the next selected channel.

In accordance with a further aspect of the invention, a resistor is connected to the local oscillator circuit in place of an oscillator tuning coil when the channel selector shaft is moved to a 13th position for selecting UHF channels. In this 13th position the tuner is operated as an IF amplifier and the local oscillator of the VHF tuner should be inoperative. This resistor provides electrical continuity between the rotor contacts but does not permit the local oscillator to function when the selector shaft is in the 13th position. However, as the station selector shaft is rotated to different VHF channels, this resistor acts in the same manner as one of the unused tuning coils to provide the desired AFT defeat action in a simple, economical and reliable manner.

It is an object, therefore, of the present invention to provide a new and improved AFT defeat circuit which eliminates one or more of the above discussed disadvantages of prior art arrangements.

It is a further object of the present invention to provide a new and improved AFT defeat circuit which eliminates the need for synchronization of mechanical follower elements, or the like, provided in such prior art arrangements.

It is another object of the present invention to provide a new and improved AFT defeat arrangement wherein the AFT defeat switching elements are positioned inside the tuner housing, thereby eliminating the leakage of oscillator energy outside the tuner housing.

It is another object of the present invention to provide a new and improved AFT defeat circuit which utilizes unused tuning coils of the tuner to successively provide an AFC defeat function as the channel selector shaft is rotated from one channel to another.

The invention both as to its organization and method of operation, together with further objects and advantages thereof, will best be understood by reference to the following specification taken in connection with the accompanying drawings, in which.

Figure 1:
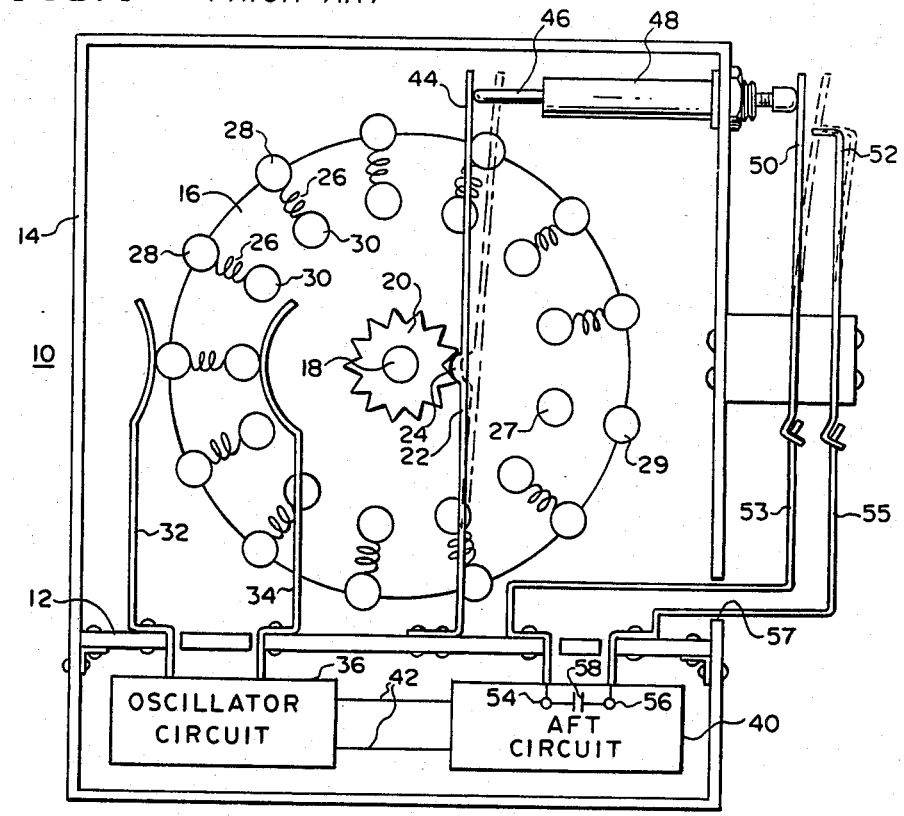
FIG. 1 is a schematic diagram of a prior art AFT defeat switch arrangement.

Considering first the prior art arrangement of FIG. 1, the television tuner 10 conventionally comprises a chassis 12 which is mounted within a housing 14 and has a rotating assembly 16 attached to the station selector shaft 18 which is rotatably mounted in the chassis 12. The station selector shaft 18 is rotationally detented by means of a detent wheel 20 which is secured thereto and cooperates with a spring loaded locator arm 22 which is mounted on the chassis 12 and is provided with the cam lobe portion 24 which accurately locates the station selector shaft 18 by engagement with the teeth of the detent wheel 20. The rotor 16 carries a number of tuning coils 26 thereon which are mounted between fixed contacts 28, 30 also mounted on the rotor 16, each of the coils 26 being connected between a different pair of contacts 28, 30. A pair of stationary stator contacts 32, 34, which are mounted on the chassis 12, cooperate with different pairs of the rotor contacts 28, 30 as the selector shaft 18 is rotated so as to connect different ones of the tuning coils 26 to the tuner oscillator circuit 36 of the tuner 10, the tuning coils 26 providing the correct tuning inductance so as to tune the oscillator 36 to the correct frequency for receiving the particular channel in which the selector shaft 18 is detented. An AFT circuit 40 is conventionally provided to control the frequency of the oscillator 36 so that when it is heterodyned with the incoming carrier the resultant I.F. signal will have the correct frequency for amplification in the I.F. amplifier of the associated television set. The AFT circuit 40 is connected to the oscillator circuit 36 by means of the conductors 42 and supplies a correction signal which has a nominal value in the absence of a received carrier signal and varies in value from this nominal value in either direction in response to a received television signal to maintain the desired I.F. frequency for optimum reception of the incoming signal. One pair of rotor contacts 27, 29, across which no tuning coil 26 is connected, is connected to the stator contacts 32, 34 when the selector shaft 18 is in a 13th detent position for UHF reception, the local oscillator 36 being inoperative in this position because of the absence of a tuning coil across the rotor contacts 27, 29.

As the shaft 18 is rotated during channel selection, rotation of the detent wheel 20 causes the deflection of the locator arm 22 and the free end 44 of the locator arm 22 urges the plunger 46, which is slidably mounted in the sleeve 48, outwardly against the flexible switch blade 50 so that the blade 50 makes contact with the adjacent flexible switch blade 52 when the blade 50 has been moved to the dotted line position shown in FIG. 1. The switch arms 50, 52 are connected by means of the wires 53, 55 to the AFT defeat control terminals 54, 56 of the AFT circuit 40 through the opening 57 in the housing 14. Closure of the switch arms 50, 52 resets the AFT circuit 40 correction signal to its nominal value by shorting the terminals 54, 56. In this connection, it will be understood that in many instances the control terminals 54, 56 of the AFT circuit 40 may comprise the conductors 42 which are supplied to the local oscillator 36. Conventionally, a large by-pass capacitor 58 is connected across the terminals 54, 56 in the AFT circuit 40, or from one of these terminals to ground, and closure of the switch arms 50, 52 also has the effect of rapidly changing the voltage across this capacitor so that the nominal value of the AFT correction signal is quickly established in preparation for reception of a signal from the next channel.

When channel selection is completed and the proper tuning coil 26 is connected to the stator contacts 32, 34, the detent locator 24 returns to its seated position and no longer makes contact with the switch blade 52 so that the AFT circuit 40 is enabled and starts from the desired nominal or quiescent value of the correction signal in maintaining control of the frequency of the oscillator circuit 36 for this new channel.

It will be observed that the above described prior art arrangement of FIG. 1 requires a number of interconnecting mechanical parts, most of which are positioned outside of the tuner 10 and requires adjustment for mechanical synchronization with the operation of the detent wheel 20. Furthermore, the switch blades 50, 52, the wires 53, 55 and the opening 57 are sources of undesired radiation which can be objectionable in many areas.

Figure 2:
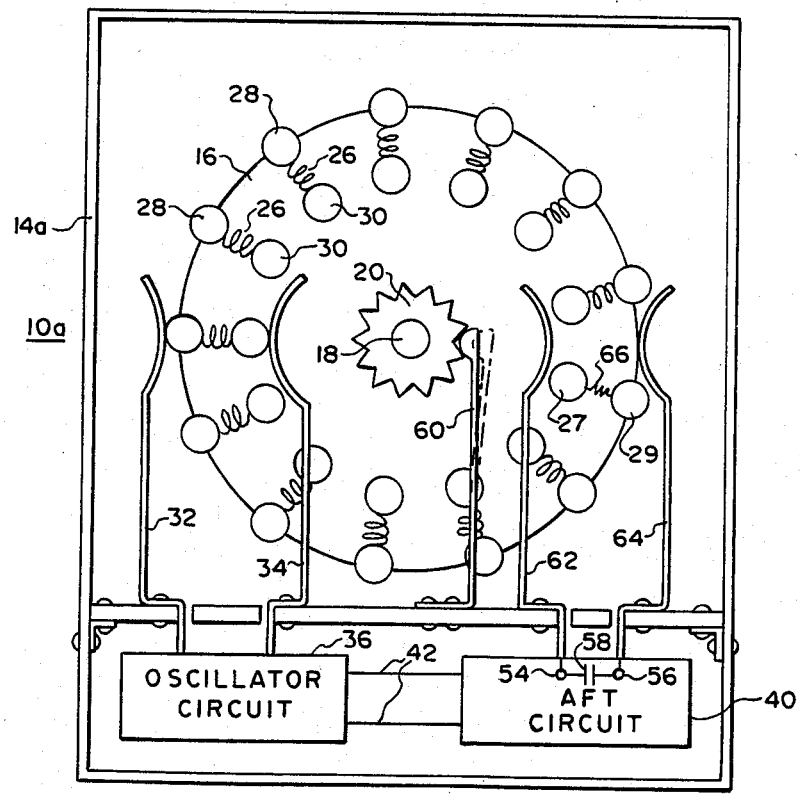
FIG. 2 is a diagrammatic view of the improved AFT defeat arrangement of the present invention.

Considering now the improved arrangement of the present invention which is shown in FIG. 2, in this figure the same circuit components as those of the prior art arrangement of FIG. 1 have been given the same reference numerals. In the improved AFT defeat arrangement of FIG. 2, a conventional detent locator arm 60 is provided with a head portion in engagement with the detent wheel 20 and the elements 44-52 and 53, 55, 57 of the prior art arrangement of FIG. 1 are eliminated. In place of these elements, a second pair of stator contacts 62, 64 are positioned inside of the tuner 10a of FIG. 2 and are connected to the control terminals 54, 56 of the AFT circuit 40 internally of the tuner. The stator contacts 62, 64 are not connected to any of the tuning coils 26, or the rotor contacts 28, 30 connected thereto, when the selector shaft 18 is in a channel receiving position such as shown in FIG. 2. However, as the shaft 18 is rotated from one channel to the next, unused ones of the tuning coils 26 are connected across the control terminals, 54, 56 of the AFT circuit by engagement of the rotor contacts 28, 30 thereof with the respective stator contacts 62, 64. The rotor contacts 28, 30, thus cooperate with the fixed stator contacts 62, 64 to provide an AFC defeat function without requiring any separate switch structure or mechanical switch actuation elements. In this connection, it will be understood that each of the tuning coils 26 consists of a relatively small number of turns and has a relatively low resistance so that connection of any one of the unused tuning coils 26 across the terminals 54, 56 has the same effect as closure of the switch contacts 50, 52 of the prior art arrangement of FIG. 1. Specifically, connection of an unused tuning coil 26 across the terminals 54, 56 sets the AFT circuit 40 to its normal quiescent state and changes the voltage across the the capacitor 58 thereof to the desired nominal value. Because there are no intermediate actuators, cams, plungers, and so forth and the same rotor 16 is used for both channel selection and AFC defeat action, synchronization of functions is assured and the provision of compensating adjustments required by the prior art arrangement of FIG. 1 is unnecessary in the improved arrangement of the present invention shown in FIG. 2. The parts count and cost of the AFC defeat circuit is thereby drastically reduced as compared to the prior art. Also, the reliability of the AFC defeat circuit is enhanced by the arrangement of the present invention. At the same time, since the connections between the AFC defeat switch elements and the associated oscillator circuits are internal, oscillator leakage is minimized.

In accordance with a further aspect of the present invention, a resistor 66 of low value is connected between the rotor contacts 27, 29 which are connected to the stator contacts 32, 34 when the channel selector shaft 18 is in a 13th position employed for UHF reception wherein the tuner 10a acts as an IF amplifier and the local oscillator circuit 36 should be deenergized. The resistor 66 does not permit the oscillator 36 to operate when it is connected to the stator contacts 32, 34 but acts like one of the unused tuning coils 26 in the other positions of the channel selector shaft 18 so as to assure AFC defeat action for all of the VHF channels. More particularly, when the selector shaft 18 is rotated so that the rotor contacts 27, 29 are momentarily engaged with the stator contacts 62, 64 the resistor 66 is placed across the control terminals of the AFC circuit 40 and functions in a manner similar to the tuning coils 26 to provide the necessary AFT defeat action. In this connection it will be understood that in a 12 position VHF only tuner the rotor contacts 27, 29 and resistor 66 would be eliminated since no 13th position for UHF would be needed.

It should be pointed out that in the arrangements of both FIG. 1 and FIG. 2 the stator contacts 32, 34 and the stator contacts 62, 64 are shown in the drawings as turned 90° from their actual position in order to illustrate more clearly the action thereof relative to the rotor contacts 28, 30. In a physical tuner the convex portion of these stator contacts faces the rotor contacts 28, 30 on the rotatable disk 16. Accordingly, when the shaft 18 is in a detented position the inner stator contact 62 may extent across and be connected to two adjacent rotor contacts 30. However, the outer stator contact 64 will not be in engagement with any of the outer rotor contacts 28 so that none of the tuning coils 26 or the resistor 66 will be connected across the control terminals 54, 56 of the AFT circuit 40 when the shaft 18 is in a detented channel receiving position.

It should also be understood that while the invention has been illustrated in connection with a rotary disk type tuner, the invention is equally applicable to tuners of the rotatable turret type, such as shown, for example, in Weigel U.S. Pat. No. 3,757,227. The Weigel patent also shows a suitable mechanical arrangement for supporting a pair of stator contacts, identified as the contacts 404 and 406 in FIGS. 8 and 15 of this patent, which are positioned to engage unused ones of the tuning coils carried on the rotatable turret structure on the tuner. However, in the Weigel patent, the stator contacts 404 and 406 are provided to supply a B plus potential to the UHF tuner when the channel selector shaft is positioned in the 13th position in which the VHF tuner is operated as an IF amplifier.

The AFT defeat arrangement of the present invention may also be used in a hybrid type of television tuner in which the oscillator section may be a rotary switch or rotary disk type arrangement and the other tuning sections of the tuner may be in the form a turret, both of these sections being mounted on a common station selector shaft, as will be readily understood by those skilled in the art.

While there has been illustrated a single embodiment of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. In a television tuner, the combination of a station selector shaft, means for detenting said station selector shaft in a plurality of station selecting positions, an oscillator circuit, a plurality of coils carried by said selector shaft, at least some of said coils being employed to tune said oscillator circuit to different frequencies corresponding to said station selecting positions, an AFT circuit for said oscillator circuit and having a pair of AFT defeat control terminals, and means for connecting an unused one of said coils across said control terminals as said shaft is moved from one station selecting position to another, at least one of said control terminals being disconnected from all of said coils when said shaft is in any one of said station selecting positions.

2. The combination of claim 1, wherein said station selector shaft has one detent position in which said tuner is operated as an IF amplifier, a resistor carried by said selector shaft and connected to said oscillator circuit when said selector shaft is moved to said one detent position, and means connecting said resistor across said control terminals as said selector shaft is moved from one station selecting position to another.

3. The combination of claim 1, which includes a plurality of rotor contacts carried by said selector shaft, different pairs of said rotor contacts being connected to different ones of said coils, a first pair of fixed stator contacts adapted to engage the rotor contacts of different ones of said oscillator coils at said station selecting positions of said selector shaft, and a second pair of fixed stator contacts connected to said control terminals at least one of which is positioned out of engagement with all of said rotor contacts in all of the detented positions of said station selector shaft, said second pair of stator contacts being adapted to engage the rotor contacts of unused ones of said coils as said selector shaft is moved between the detented positions thereof.

4. The combination of claim 3, wherein said station selector shaft has one detent position in which said oscillator circuit is inoperative, and a resistor carried by said selector shaft and positioned to engage said first pair of stator contacts in said one detent position of said station selector shaft, said resistor being connected to said second pair of stator contacts as said selector shaft is rotated.

5. The combination of claim 4, wherein said AFT circuit includes a capacitor connected to at least one of said control terminals, and said resistor returns the voltage across said capacitor to a desired nominal value during the period when it is connected to said second pair of stator contacts.

6. The combination of claim 1, wherein said AFT circuit includes a capacitor connected to at least one of said control terminals, and said unused coils successively return the voltage across said capacitor to a desired nominal value as said selector shaft is rotated.

* * * * *